(12) United States Patent
Madhavan et al.

(10) Patent No.: US 9,595,943 B2
(45) Date of Patent: Mar. 14, 2017

(54) IMPLEMENTING BROADBAND RESONATOR FOR RESONANT CLOCK DISTRIBUTION

(71) Applicant: GLOBALFOUNDRIES Inc., Grand Cayman (KY)

(72) Inventors: Santhosh Madhavan, Bangalore (IN); Giri N. K. Rangan, Bangalore (IN); Patrick I. Rosno, Rochester, MN (US); Timothy J. Schmerbeck, Mantorville, MN (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 154 days.

(21) Appl. No.: 14/509,242

(22) Filed: Oct. 8, 2014

(65) Prior Publication Data

US 2016/0105161 A1    Apr. 14, 2016

(51) Int. Cl.
*H03K 3/012* (2006.01)
*H03K 5/00* (2006.01)

(52) U.S. Cl.
CPC .............. *H03K 3/012* (2013.01); *H03K 5/00* (2013.01)

(58) Field of Classification Search
CPC ........................................................ H03K 3/012
See application file for complete search history.

(56) References Cited

U.S. PATENT DOCUMENTS

| | | | |
|---|---|---|---|
| 5,734,285 A * | 3/1998 | Harvey .............. | H03K 3/037 327/291 |
| 7,571,410 B2 | 8/2009 | Restle | |
| 8,258,882 B2 | 9/2012 | Shibasaki et al. | |
| 8,461,873 B2 | 6/2013 | Ishii et al. | |
| 8,502,569 B2 | 8/2013 | Papaefthymiou et al. | |
| 8,791,742 B2 * | 7/2014 | Garg .................. | H03K 5/135 327/291 |
| 9,041,451 B2 * | 5/2015 | Papaefthymiou ......... | G06F 1/10 327/291 |
| 2012/0044958 A1 | 2/2012 | Raghavan et al. | |
| 2013/0049840 A1 | 2/2013 | Van Goor et al. | |

OTHER PUBLICATIONS

Chueh, Juang-Ying et al., "Two-phase resonant clock distribution", VLSI, 2005. Proceedings. IEEE Computer Society Annual Symposium on Digital Object Identifier: 10.1109/ISVLSI.2005.74 Publication Year: 2005, pp. 65-70.

Chan, Steven C et al., "A Resonant Global Clock Distribution for the Cell Broadband Engine Processor" IEEE Journal of Solid-State Circuits, vol. 44, Issue: 1, Publication Year: 2009, pp. 64-72.

* cited by examiner

*Primary Examiner* — Hai L Nguyen
(74) *Attorney, Agent, or Firm* — Heslin Rothenberg Farley & Mesiti P.C.; George Blasiak

(57) ABSTRACT

A method and circuit for implementing a broadband resonator for resonant clock distribution, and a design structure on which the subject circuit resides are provided. The circuit includes a pair of first inductors, and a second inductor and a capacitor coupled between a respective first end of the respective first inductors. An opposite free end of the respective first inductors is connected to a respective clock transmission line and connected in parallel to a load capacitance. A frequency response of the circuit includes two poles and a zero in a frequency band of the resonant clock distribution system.

8 Claims, 13 Drawing Sheets

IMPLEMENTING BROADBAND RESONATOR FOR RESONANT CLOCK DISTRIBUTION

FIELD OF THE INVENTION

The present invention relates generally to the data processing field, and more particularly, relates to a method and circuit for implementing a broadband resonator for resonant clock distribution, and a design structure on which the subject circuit resides.

DESCRIPTION OF THE RELATED ART

Clock distribution for high speed serial input/output (I/O) requires a significant amount of power and tend to contribute a large share of the total power dissipation of an integrated circuit chip. Large complementary metal oxide semiconductor (CMOS) or current mode logic (CML) buffers drive long on-chip transmission line structures to deliver low-jitter, high frequency clocks to serializers, deserializers, and other signal processing circuits.

CMOS clocks are popular due to the ease of buffering and reduced static power dissipation. CMOS buffers generally drive large capacitive loads consisting of long transmission lines and MOS transistor type loads at the far end of the transmission line. One way to reduce power in such clock distribution networks is to use a resonant clocking scheme.

Resonant clocking involves introducing an inductive element into the clock distribution network such that the inductive element and the total load capacitance of the clock distribution network are resonant at the frequency of the clock being distributed. At the resonant frequency of the circuit, the inductor stores and supplies a portion of the energy required to charge/discharge the load capacitor. This reduces energy drawn from the clock buffer to charge and discharge the load capacitor, and reduces the power consumption of the clock distribution network. The clock buffers now supply only the energy lost in each clock cycle. Thus significant power savings can be achieved.

Clock distribution networks with a single resonant frequency have a narrow band of frequencies where they provide power savings as well as low distortion clocks. If resonant clock distribution networks are forced to work at frequencies below the resonant frequency the clock waveform is distorted due to the inductive nature of the resonant circuit. This means that for applications where operation over a wide band of frequencies is expected resonant clock distribution networks would have to be designed such that the resonant frequency is set to the lowest frequency of operation. In a system which employs a wide frequency range of operation setting the resonant frequency to the lowest frequency of operation means that for higher frequencies of operation, the power savings obtained is significantly reduced.

Another way to ensure wide frequency range of operation uses tuning techniques either to change the inductance or to change the capacitance to dynamically change the operating frequency. These tuning methods often use resistive switches which reduce the overall quality factor (Q) of the resonant system, thus reducing the power savings that can be made.

A need exists for an effective mechanism for implementing a broadband resonator for resonant clock distribution. It is desirable to provide such mechanism to allow for effective resonant frequency operation over a wide operating frequency band with low waveform distortion, providing moderate power savings over the entire operating frequency range.

SUMMARY OF THE INVENTION

Principal aspects of the present invention are to provide a method and circuit for implementing a broadband resonator for resonant clock distribution, and a design structure on which the subject circuit resides. Other important aspects of the present invention are to provide such method, circuit, and design structure substantially without negative effects and to overcome many of the disadvantages of prior art arrangements.

In brief, method and circuit for implementing a broadband resonator for resonant clock distribution, and a design structure on which the subject circuit resides are provided. The circuit includes a pair of first inductors, and a second inductor and a capacitor coupled between a respective first end of the respective first inductors. An opposite free end of the respective first inductors is connected to a respective clock transmission line and connected in parallel to a load capacitance. A frequency response of the circuit includes two poles and a zero in a frequency band of the resonant clock distribution system.

In accordance with features of the invention, the circuit enables a wide frequency band of operation with less waveform distortion as compared to a resonant clocking system with single resonant frequency.

In accordance with features of the invention, a variable resistor optionally provided in series with the second inductor is used to adjust a gain variation of the resonant structure between the two poles.

In accordance with features of the invention, a variable resistor optionally provided in series with the capacitor is used to adjust a gain variation of the resonant structure between the two poles.

In accordance with features of the invention, the circuit resonates with load capacitance including capacitance of the transmission line and far end load capacitance at the far end of the transmission line.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing a broadband resonator for resonant clock distribution, and a design structure on which the subject circuit resides are provided. The circuit includes a pair of first inductors L1, and a second inductor L2 together with a capacitor C2 coupled between respective first ends of the respective first inductors. A free end of the first inductors is connected to a respective clock transmission line CLKP, CLKN in parallel to a load capacitance CL. A frequency response of the circuit includes two poles and a zero in a frequency band of the resonant clock distribution system.

Figure 1:
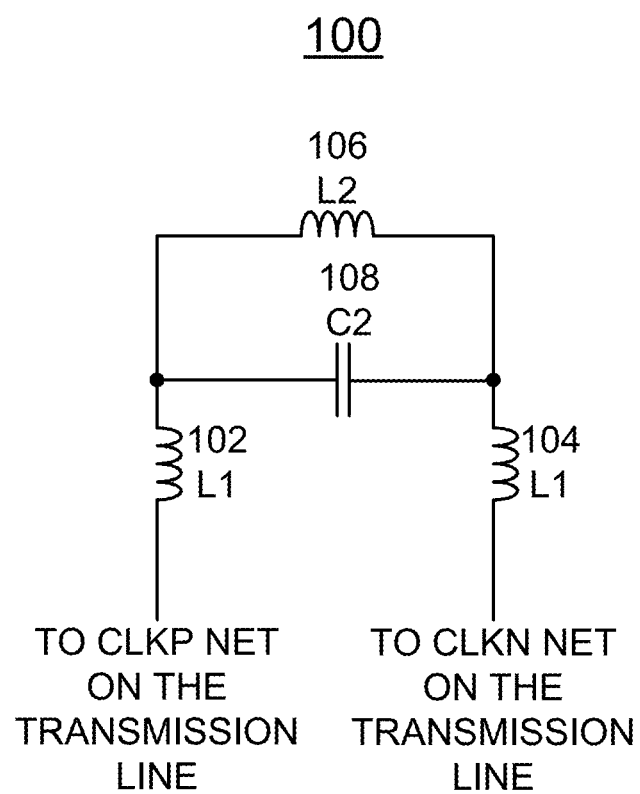
FIG. 1 schematically illustrates an example circuit for implementing a broadband resonator for resonant clock distribution in accordance with the preferred embodiment.

Having reference now to the drawings, in FIG. 1, there is shown an exemplary circuit generally designated by the reference character 100 for implementing a broadband resonator for resonant clock distribution in accordance with the preferred embodiment. The circuit 100 includes a pair of first inductors 102, 104, L1 and a second inductor 106, L2 together with a capacitor 108, C2 connected between respective first ends of the respective first inductors 102, 104, L1. A free end of the first inductors 102, 104, L1 is connected to a respective clock transmission line connected in parallel to a load capacitance CL (not shown) in FIG. 1.

In accordance with the preferred embodiment, a frequency response of the circuit 100 includes two poles and a zero in a frequency band of a resonant clock distribution system. In the differential resonant clocking circuit 100 of the invention, the position of these poles and zeros with respect to each other flattens the frequency response over a broad range of frequencies.

Figure 2:
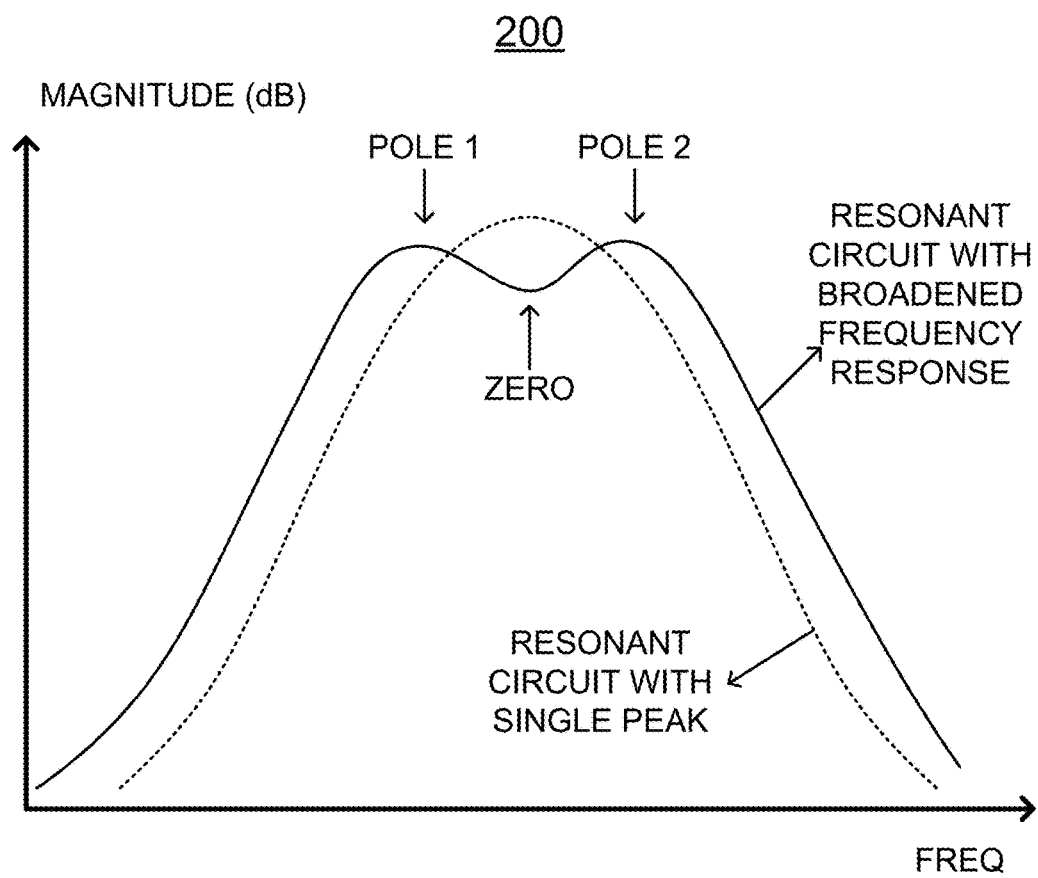
FIG. 2 illustrates example operations of the circuit of FIG. 1 with an example waveform not to scale for comparison with a resonant circuit with a single frequency peak in accordance with the preferred embodiment.

Referring also to FIG. 2, there are shown example operations of the circuit 100 with an example waveform not to scale generally designated by the reference character 200 in accordance with the preferred embodiment for comparison with a resonant circuit with a single frequency peak shown in dotted line. The illustrated waveform 200 includes magnitude in dB shown with respect to the vertical axis and frequency shown with respect to the horizontal axis. For example, the illustrated waveform 200 includes two poles and a zero in a frequency band of a resonant clock distribution system.

For example, a resonant clocking system using a single resonant frequency can be tuned to be resonant either at some mid frequency in the frequency band of interest as shown in FIG. 2, or at the lowest frequency in the frequency band of interest. If such a system is tuned to a mid-frequency, then the clock waveforms will be distorted at the lower end of the frequency band of interest. If it is tuned to the lowest frequency of operation, then the power savings obtained at the highest frequency of operation reduces and the amplitude of the clock varies a lot over the entire frequency band.

In accordance with the preferred embodiments, the phase response of a system with circuit 100 is such that the clock waveform passing through the transmission line has less distortion as compared to a resonant clocking system with a single resonant frequency. This broadened frequency response of a system with circuit 100 allows it to be used in various applications where a broad range of operating frequencies is expected.

It should be understood that the scope of the present invention is not limited to the illustrated operation and example waveform 200, for example, various broadened frequency responses and resonant frequencies can be implemented based upon the value of the first inductors L1, the second inductor L2 and the capacitor C2.

Figure 3:
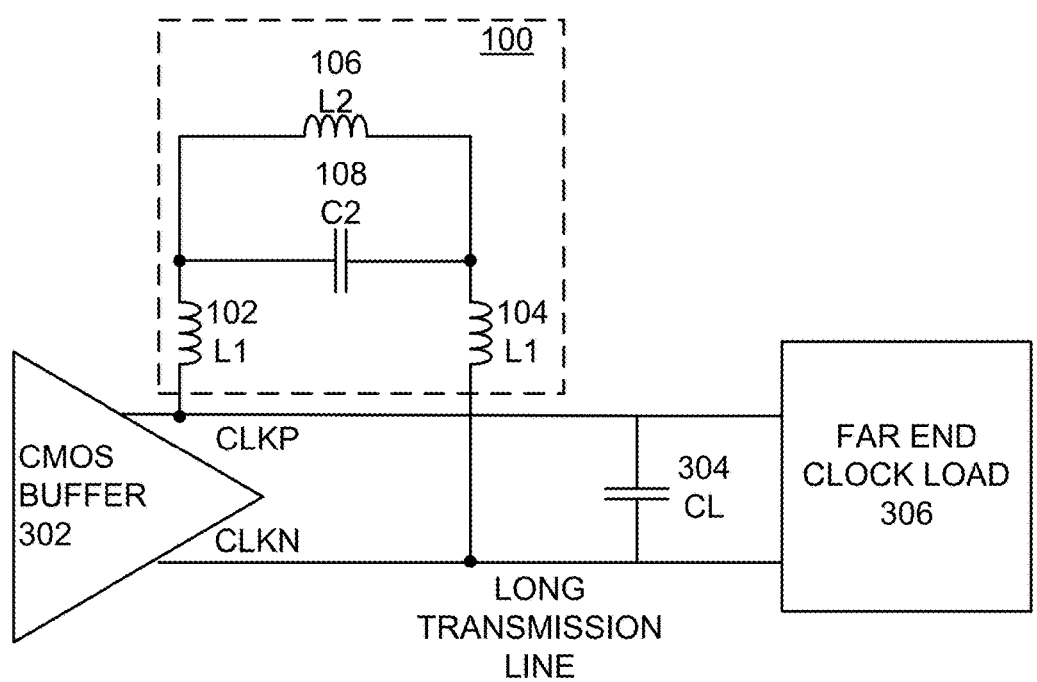
FIG. 3 schematically illustrates the example circuit of FIG. 1 with a resonant clock distribution system in accordance with the preferred embodiment.

Referring to FIG. 3, there is shown a resonant clock distribution system generally designated by the reference character 300 including the example circuit 100 in accordance with the preferred embodiment. The resonant clock distribution system 300 includes circuit 100 consists of two L1 inductors 102, 104, one L2 inductor 106 and one C2 capacitor 108 connected between respective outputs CLKP, CLKN of a CMOS buffer 302. The L1 inductor is duplicated to implement the two L1 inductors 102, 104 to keep the circuit 100 symmetrical for the differential clock distribution network 300. The circuit 100 resonates with a CL capacitance 304 which represents the capacitance of the transmission line and load capacitance at the far end of the transmission line at a far end clock load 306. The entire circuit is driven by simple CMOS buffers 302 built using standard CMOS inverters.

The frequency response of the system ignoring the resistance of the inductors is given by the following set of equations:

$$H(s) = \frac{2s^3 L1 L2 C2 + s(L2 + 2L1)}{2s^4 L1 L2 C2 CL + s^2(2L1CL + L2CL + L2C2) + 1}$$

The poles and zeros for the circuit 100 can be obtained by the following set of equations, ignoring the resistance of the inductor:

$f_{z1} = 0$ $f_{z2} = (\frac{1}{2}*pi)(((\frac{1}{2}L1)+(1/L2))(1/C2))^{1/2}$ $f_{z2} = (\frac{1}{2}*pi)((2L1CL+L2CL+L2C2)-(K))/(4L1L2C2CL))^{1/2}$ $f_{P1} = (\frac{1}{2}*pi)((2L1CL+L2CL+L2C2)+(K))/(4L1L2C2CL))^{1/2},$ Where K is given by the equation:

$$K=((2L1CL+L2CL+L2C2)^2-(8L1L2C2CL))^{1/2}$$

For example, there are total of 3 zeros and 4 poles with $f_{Z1}$, $f_{P1}$ and $f_{P2}$ being complex conjugate pairs. These equations ignore the resistance of the inductors L1 , L2 and transmission line but pole and zero frequencies calculated using these equations is close to the actual value considering the resistance of the resonant circuit 100.

In accordance with the preferred embodiments, the resistance of the inductors L1, L2 forms an important part of circuit 100 and system 300. This resistance ensures that the variation of the gain of the resonant structure is not too much over the entire frequency range. If the resistance is negligible, the gain of the resonant structure drops drastically and the resonant structure cannot be used over a continuous band of frequencies. The circuit 100 thus requires careful consideration of the resistance of the inductors L1, L2 to ensure a continuous band of frequencies is available. If the resistance of the inductors L1 , L2 is negligible then the structure may be modified to either of two circuits 400, 500 respectively shown in FIGS. 4 and 5 to introduce a variable resistance which is tuned to adjust the gain variation of the resonant structure between its two poles.

Figure 4:
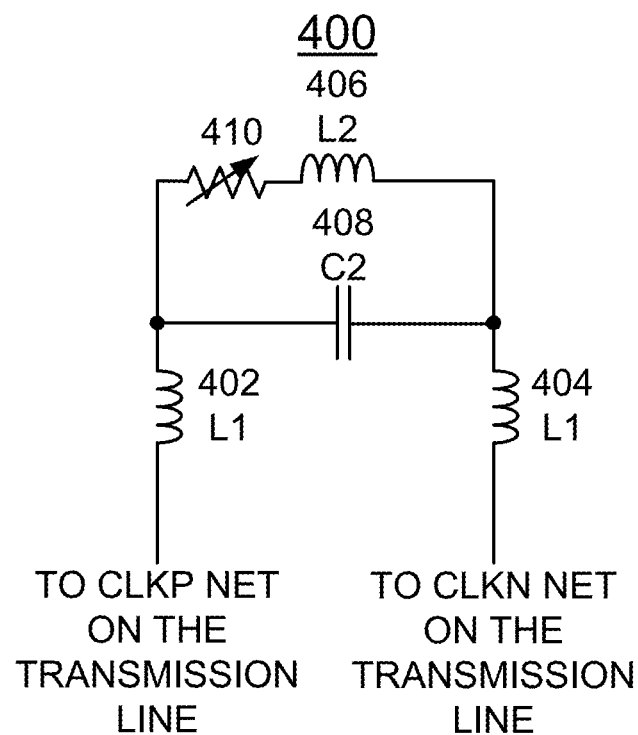
FIG. 4 schematically illustrates another example circuit for implementing a broadband resonator for resonant clock distribution in accordance with the preferred embodiment.

Referring to FIG. 4, there is shown another example circuit generally designated by the reference character 400 for implementing a broadband resonator for resonant clock distribution in accordance with the preferred embodiment. The circuit 400 includes a pair of first inductors 402, 404, L1 and a second inductor 406, L2 together with a capacitor 408, C2 and a variable resistor 410 connected between the first inductor 402, L1 and the second inductor 406, L2. The variable resistor 410, and the capacitor 408, C2 are connected to a first end of the first inductor 402, and the second inductor 406, L2 and the capacitor 408, C2 are connected to a first end of the first inductor 404, L1, as shown. A free end of the first inductors 402, 404, L1 is connected to a respective clock transmission line CLKP, CLKN connected in parallel to a load capacitance CL, such as shown in FIG. 3. The variable resistor 410 is tuned to adjust the gain variation of the resonant structure between its two poles of circuit 400.

Figure 5:
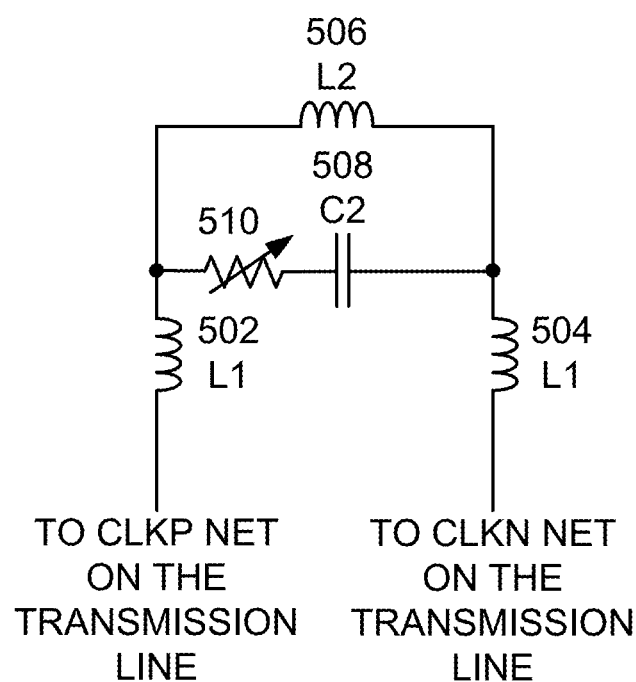
FIG. 5 schematically illustrates another example circuit for implementing a broadband resonator for resonant clock distribution in accordance with the preferred embodiment.

Referring to FIG. 5, there is shown another example circuit generally designated by the reference character 500 for implementing a broadband resonator for resonant clock distribution in accordance with the preferred embodiment. The circuit 500 includes a pair of first inductors 502, 504, L1 and a second inductor 506, L2 together with a capacitor 508, C2 and a variable resistor 510 connected between the first inductor 502, L1 and the capacitor 508, C2. The variable resistor 510, and the second inductor 506, L2 are connected to a first end of the first inductor 502, and the second inductor 506, L2 and the capacitor 508, C2 are connected to a first end of the first inductor 404, L1, as shown. A free end of the first inductors 502, 504, L1 is connected to a respective clock transmission line CLKP, CLKN connected in parallel to a load capacitance CL, such as shown in FIG. 3. The variable resistor 510 is tuned to adjust the gain variation of the resonant structure between its two poles of circuit 500.

In accordance with features of the invention, the respective resonant clocking circuits 100, 400, 500 require substantially less power as compared to many conventional CMOS clocking arrangements while maintaining a high quality clock signal.

Figure 6:
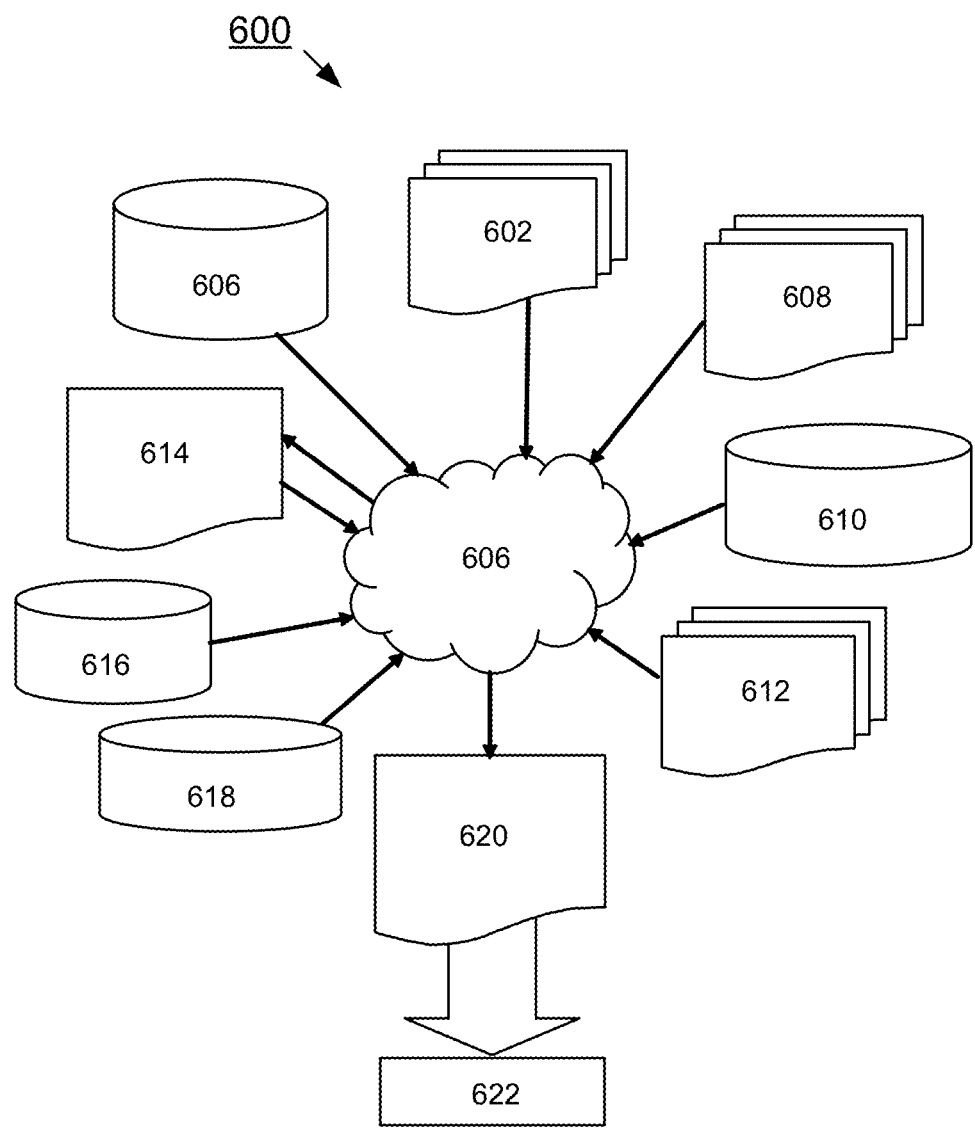
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuits 100, 400, 500, in the form of schematics or HDL, a hardware-description language, for example, Verilog, VHDL, C, and the like. Design structure 602 may be contained on one or more machine readable medium. For example, design structure 602 may be a text file or a graphical representation of the circuits 100, 400, 500. Design process 604 preferably synthesizes, or translates, circuits 100, 400, 500, into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 32 nm, 45 nm, 90 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1, 4 and 5 along with any additional integrated circuit design or data (if applicable), into a second design structure 620. Design structure 620 resides on a storage medium in a data format used for the exchange of layout data of integrated circuits, for example, information stored in a GDSII (GDS2), GL, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 4 and 5. Design structure 620 may then proceed to a stage 622 where, for example, design structure 620 proceeds to tape-out, is released to manufacturing, is released to a mask house, is sent to another design house, is sent back to the customer, and the like.

FIGS. 7-11 illustrate example operations of the circuits of FIGS. 1, 4, and 5 with respective example waveforms not to scale in accordance with the preferred embodiment for comparison with a resonant circuit with a single frequency peak.

Figure 7:
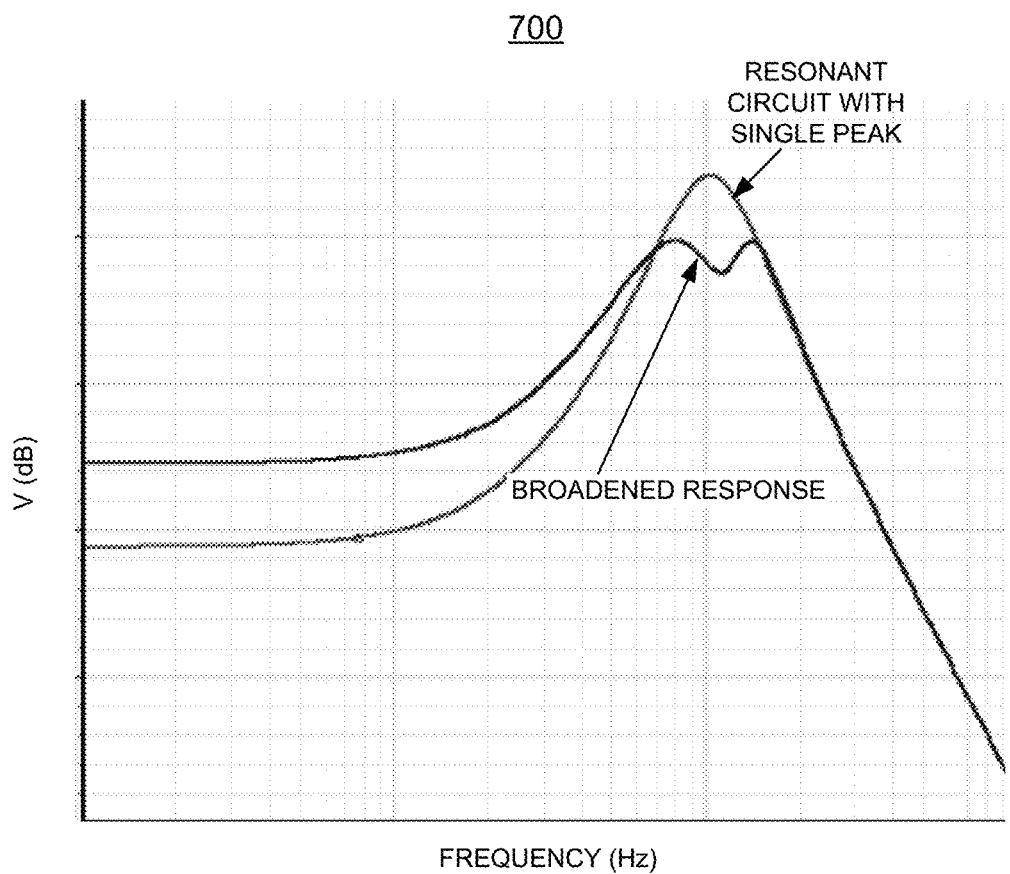
FIGS. 7-11 illustrate example operations of the circuits of FIGS. 1, 4, and 5 with respective example waveforms not to scale in accordance with the preferred embodiment for comparison with a resonant circuit with a single frequency peak.

Referring to FIG. 7, there are shown example operations of the circuit 100, 400, 500 with an example waveform not to scale generally designated by the reference character 700 in accordance with the preferred embodiment for comparison with a resonant circuit with a single frequency peak. The illustrated waveform 700 includes magnitude in dB shown with respect to the vertical axis and frequency shown with respect to the horizontal axis. For example, the illustrated waveform 700 includes two poles and a zero in a frequency band of a resonant clock distribution system.

The illustrated waveform 700 shows the broadened frequency response of the circuit 100 with ideal components with the only non-ideality being the resistance of the inductors. The frequency response of a circuit with single peak is also provided for comparison purposes. The single peak circuit has been tuned to keep the resonant frequency close to the mid-frequency of the proposed circuit. The single peak resonant circuit can also be tuned to be resonant at the lowest frequency of operation in order to reduce the waveform distortion; however that will reduce the amplitude of the clock at higher frequencies and also reduce the power savings obtained at higher frequencies. The broadened frequency response of the circuit 100 includes a magnitude response showing that the magnitude tends to be lower than the reference circuit but is substantially constant through the frequency band of interest.

Figure 8:
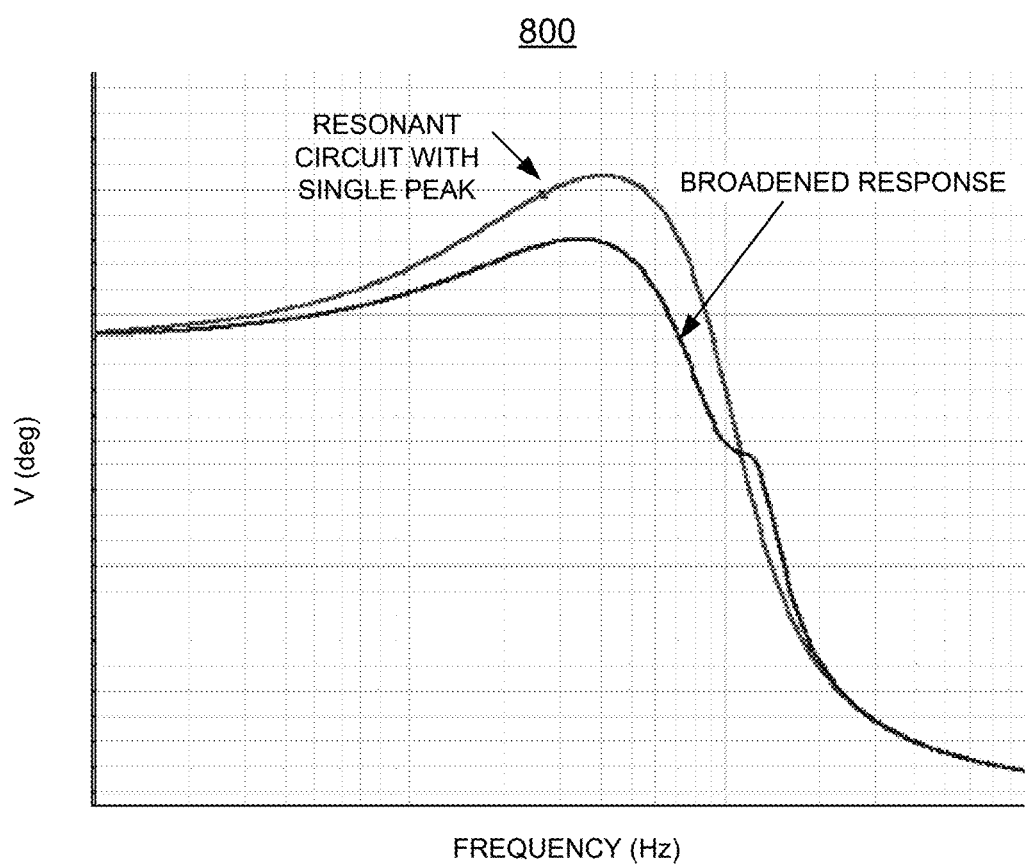

Referring to FIG. 8, there are shown example operations of the circuit 100, 400, 500 with an example phase response waveform not to scale generally designated by the reference character 800 in accordance with the preferred embodiment for comparison with a resonant circuit with a single frequency peak. The illustrated phase response waveform 800 includes phase in degrees shown with respect to the vertical axis and frequency shown with respect to the horizontal axis.

As it can be seen from the phase response waveform 800, the phase change of the circuit 100 is slowed down due to the introduction of an additional zero into the system. In other words the phase response is flat in the frequency band of interest. This is advantageous when compared with the single peak circuit, since it reduces the distortion of the clock waveform.

Figure 9:
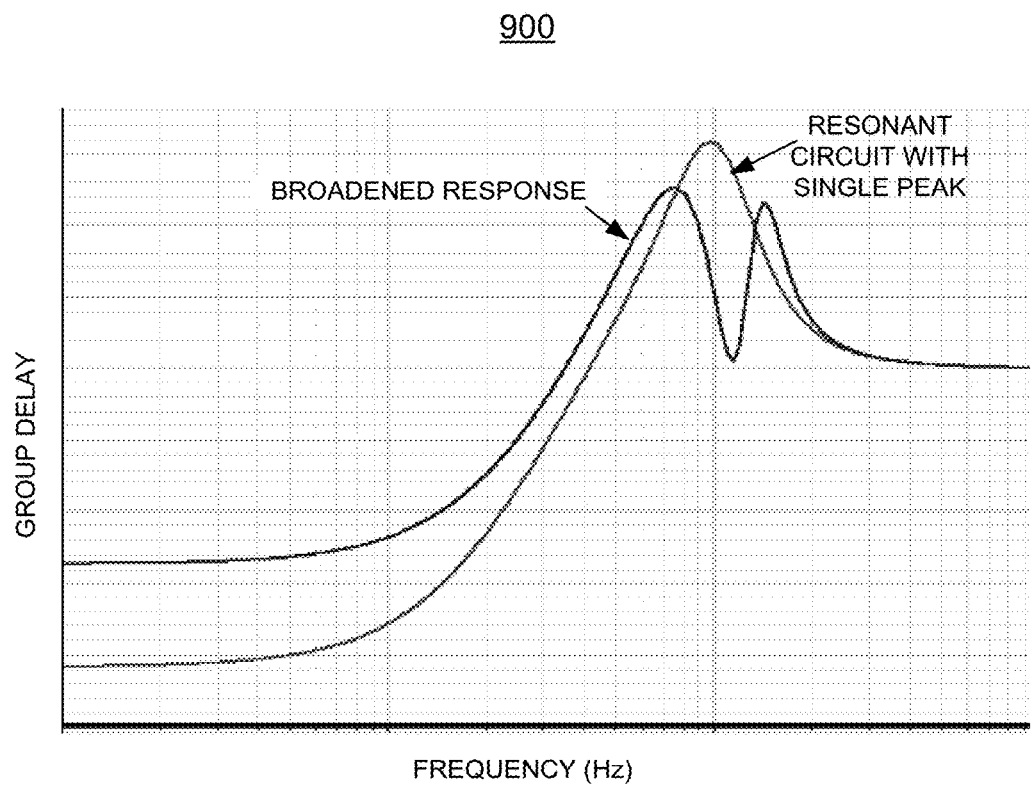

Referring to FIG. 9, there are shown example operations of the circuit 100, 400, 500 with an example group delay waveform not to scale generally designated by the reference character 900 in accordance with the preferred embodiment for comparison with a resonant circuit with a single frequency peak. The illustrated group delay waveform 900 includes phase in degrees shown with respect to the vertical axis and frequency shown with respect to the horizontal axis. It can be seen that the group delay for the circuit 100 drops close to zero indicating the slowdown in the phase change at mid-frequency of operation. This means that at that particular frequency the signal experiences the least distortion.

Figure 10:
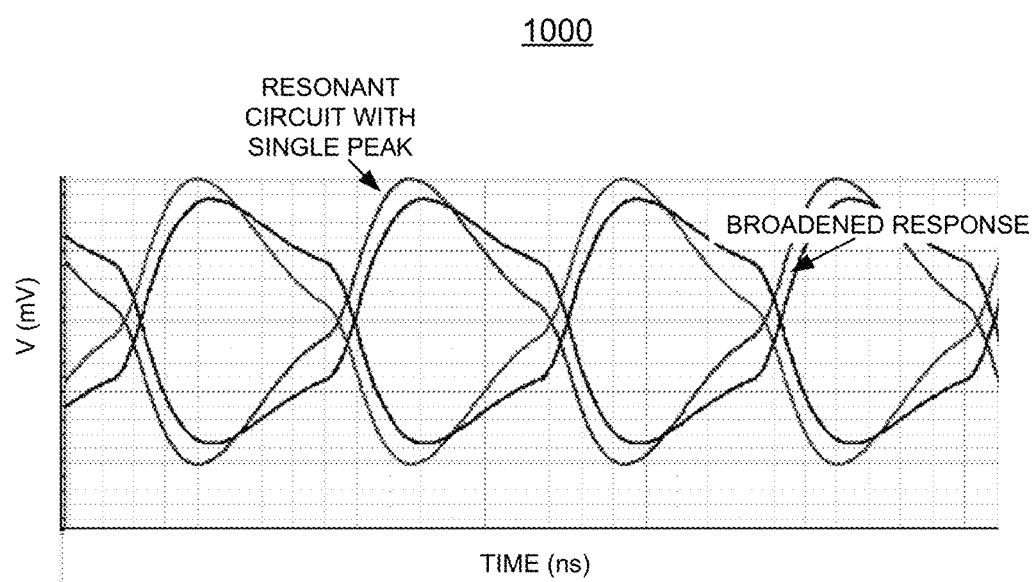
Figure 11:
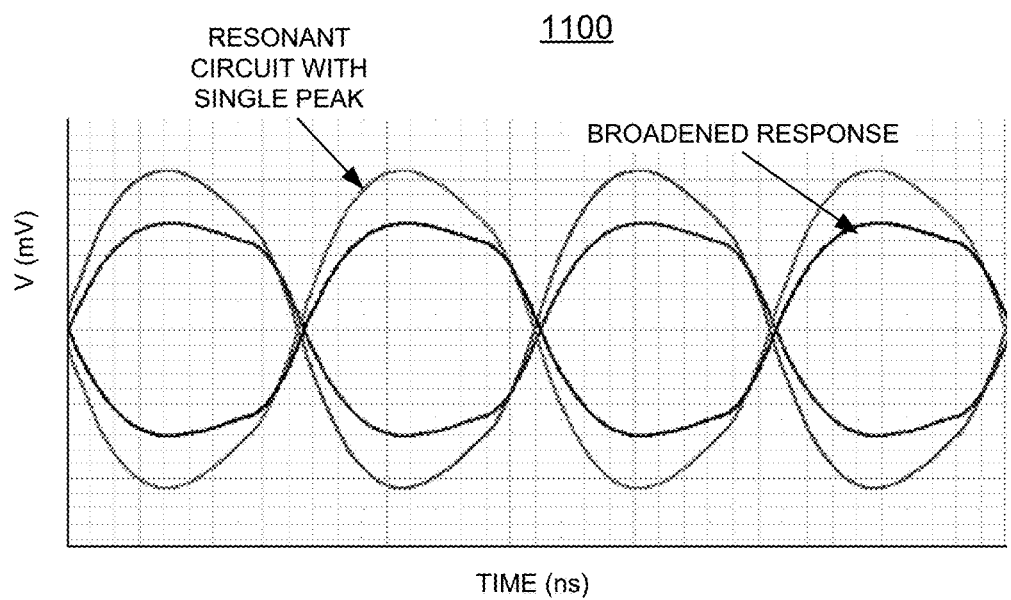

Referring to FIGS. 10 and 11, there are shown example operations of the circuit 100, 400, 500 with example frequency waveforms not to scale generally designated by the respective reference character 1000, 1100 in accordance with the preferred embodiment for comparison with a resonant circuit with a single frequency peak. The illustrated example frequency waveforms 1000, 1100 includes amplitude in mV shown with respect to the vertical axis and frequency shown with respect to the horizontal axis. The waveforms 1000, 1100 are for comparison purposes only. In FIG. 10, it can be seen that at low frequencies the single peak circuit causes distortion due to the inductive nature of the single peak circuit whereas for the circuit 100 the distortion is less due to the phase response of the circuit 100. At a mid-frequency in the frequency band of interest, the waveform distortion in both the circuits is reduced. The single peak resonant circuit produces a sine wave like waveform while the proposed circuit has more square waveforms due to the reduced group delay.

At higher frequencies (not shown) the single peak circuit and circuit 100 have substantially identical waveforms. It can be seen that the circuit 100 is better at working over a larger range of frequencies due its reduced distortion at low frequencies. Another point to note is that in the circuit 100 the amplitude of the clock more or less remains constant over the entire frequency range which makes it easier to design. Both features of circuit 100 aid in tolerating process variations in a better way.

It should be understood that the present invention is not limited to the illustrated circuits 100, 400, 500; various additional circuit design variations can be implemented. For example, each of the circuits 100, 400, 500 can be modified with the addition of a DC blocking capacitor for use in applications where the clocks can be held in a static DC state. For example, the second inductor L2 can be split into two equal inductor segments L2_P, L2_N and a DC blocking capacitor DC block added in between the two equal inductor segments, as illustrated and described with respect to FIGS. 12 and 13. The total series inductance of inductor segments L2_P and L2_N is the same as the original L2 inductance. This variation performs essentially the same as the original respective circuits 100, 400, 500 as the DC blocking capacitor is a very low frequency capacitor and does not interfere with the normal functional frequency range of the broadband resonator circuits. The change now allows the respective circuits 100, 400, 500 to be open at DC (stopped clocks) to prevent short circuit from the CLKP to CLKN nets.

For example, U.S. Pat. No. 8,729,975 issued on May 20, 2014 to Van Goor et al., and assigned to the present assignee, discloses an on-chip inductor and an on-chip DC blocking capacitor connected between a pair of differential active clock load nodes labeled $CLK_{OUT}$, $CLK_{OUT\_B}$ forming a resonant tank circuit. The on-chip inductor includes two coils, such as concentric coils, with one coil connected to the true clock node $CLK_{OUT}$ and the other coil connected to the compliment node $CLK_{OUT\_B}$. The series capacitor creates an open at DC, enabling DE testing while eliminating lossy field effect transistor (FET) switches often used with a convention tank circuit to take the inductor out of operation for DC testing.

The modified circuit with the addition of a DC blocking capacitor added in between the two equal inductor segments L2_P, L2_N 212 advantageously can be implemented or fabricated by an on-chip inductor and an on-chip capacitor as disclosed in the above-identified U.S. Pat. No. 8,729,975. The subject matter of the above-identified U.S. Pat. No. 8,729,975 is incorporated herein by reference in its entirety.

Figure 12:
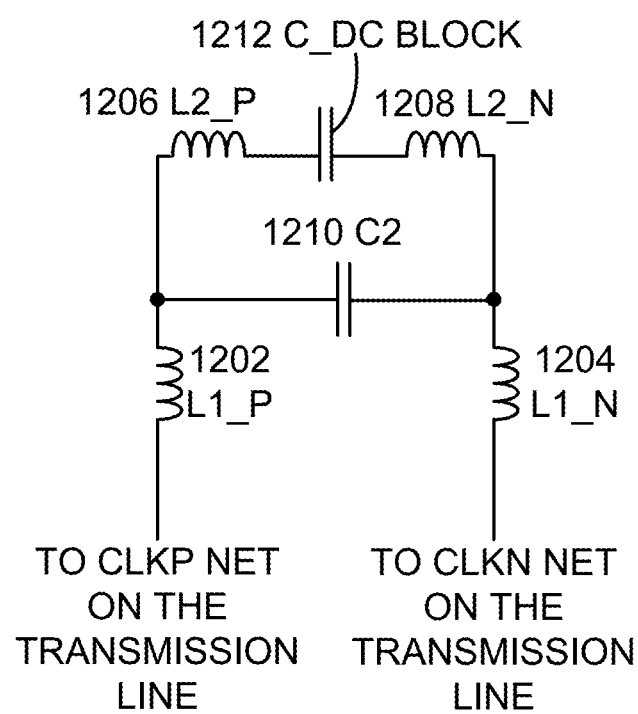
FIGS. 12 and 13 schematically illustrate another example circuit for implementing a broadband resonator for resonant clock distribution in accordance with the preferred embodiment.

Referring to FIG. 12, there is shown another example circuit generally designated by the reference character 1200 for implementing a broadband resonator for resonant clock distribution in accordance with the preferred embodiment. The circuit 1200 includes a pair of first inductors 1202, L1_P, 1204, L1_N, and a pair of second inductor segments or inductors 1206, L2_P, 1208_L2_N together with a capacitor 1210, C2 connected between a respective connection of inductors 1202, L1_P, and 1206_L2_P and inductors 1204 L1_N, 1208_L2_N. A DC blocking capacitor 1212, C_DC-BLOCK is connected between the inductor 1206_L2_P and inductor 1208_L2_N. A free end of the first inductors 1202, L1_P, 1204, L1_N, is connected to a respective clock transmission line connected in parallel to a load capacitance CL (not shown) in FIG. 12. The second inductor segments or inductors 1206, L2_P, 1208_L2_N are equal in inductor segments and have a total series inductance equal to the original L2 inductance of the second inductor 106, L2 of circuit 100.

The circuit 1200 performs essentially the same as the circuit 100 of FIG. 1, as the DC blocking capacitor 1212, C_DCBLOCK is a very low frequency capacitor and so does not interfere with the normal functional frequency range of the broadband resonator circuit 100 as described and illustrated above. The enhanced circuit 1200 allows the circuit to be open at DC (stopped clocks) to prevent short circuit from the CLKP to CLKN nets.

Figure 13:
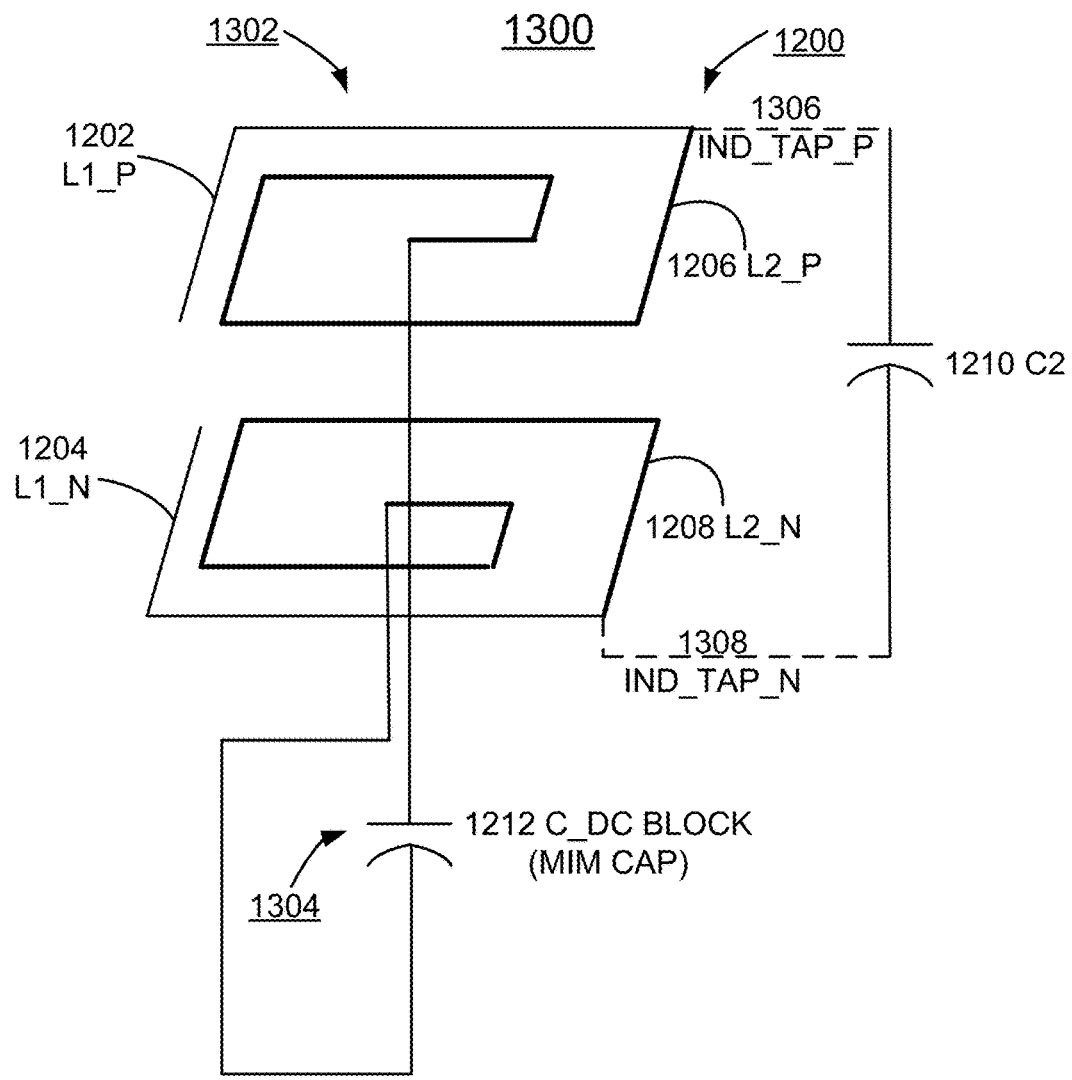

Referring also to FIG. 13, there is shown another example physical implementation generally designated by the reference character 1300 of the circuit 1200. The physical implementation is very important to the performance of this broadband inductor and to the area used to implement it. As schematically shown in FIG. 12 circuit 1200 requires four inductors and two capacitors, which could use a large amount of space. Also it would be difficult to optimize all the mutual inductance and capacitance terms between all these elements leading to additional loss terms and possibly a very low overall Q. A very efficient implementation is shown in FIG. 13 to achieve a high overall Q and drastically minimize the area required.

As shown in FIG. 13, circuit 1200 consists of essentially a stack generally designated 1302 of two tapped inductors on top of each other which are all stacked on top of a MIM (metal-insulator-metal) capacitor generally designated 1304. This allows for all the inductors 1202, L1_P, 1206, L2_P, 1204, L1_N, and 1208, L2_N to be wound in all the same direction for maximum mutual inductance giving the best Q performance. The inductors 1202, L1_P, 1206, L2_P include a first tap 1306, IND_TAP_P and inductors 1204, L1_N, and 1208, L2_N include a first tap 1308, IND_TAP_N respectively connected to the second capacitor 1210 C2. The inductors 1202, L1_P, 1206, L2_P and inductors 1204, L1_N, and 1208, L2_N are respectively connected to the MIM capacitor 1304 implementing DC blocking capacitor 1212, C_DCBLOCK. The use of MIM capacitor 1304 for the DC blocking capacitor 1212 also provides a low loss capacitor as well. This physical implementation 1300 also then requires area-wise the area for essentially one inductor for the stack 1302 of inductor 1202, L1_P in series with inductor 1206 L2_P, and inductor 1204, L1_N in series with inductor 1208, L2_N and MIM capacitor 1304 implementing DC blocking capacitor 1212, C_DCBLOCK, and one capacitor 1210, C2.

While the present invention has been described with reference to the details of the embodiments of the invention shown in the drawing, these details are not intended to limit the scope of the invention as claimed in the appended claims.

What is claimed is:

1. A circuit for implementing a broadband resonator for resonant clock distribution comprising:
   a pair of first inductors;
   a second inductor and a capacitor coupled between a respective first end of the respective first inductors;
   an opposite free end of the respective first inductors connected to a respective clock transmission line and connected in parallel to a load capacitance of a clock distribution system forming the broadband resonator; and
   the broadband resonator having a frequency response including two poles and a zero in a predefined frequency band of the resonant clock distribution system.

2. The circuit as recited in claim 1 wherein said frequency response is substantially flat in the predefined frequency band.

3. The circuit as recited in claim 1 includes a variable resistor connected in series with the capacitor and to one said first end of the first inductors.

4. The circuit as recited in claim 1 includes a variable resistor connected in series with the second inductor and to one said first end of the first inductors.

5. The circuit as recited in claim 1 wherein said second inductor includes two inductor segments, said two inductor segments of said second inductor having substantially equal inductance value.

6. The circuit as recited in claim 5 includes a DC blocking capacitor connected in series between the inductor segments of said second inductor.

7. The circuit as recited in claim 6 wherein said DC blocking capacitor includes a metal insulator metal (MIM) capacitor.

8. The circuit as recited in claim 6 wherein said pair of first inductors and said two inductor segments of said second inductor include an inductor stack of tapped inductors.

\* \* \* \* \*